United States Patent [19]
Lee

[11] Patent Number: 5,412,355
[45] Date of Patent: May 2, 1995

[54] RESONANT BALUN WITH ARBITRARY IMPEDANCE

[75] Inventor: Sheng-Hann Lee, Cupertino, Calif.

[73] Assignee: Philips Electronics North America Corporation, New York, N.Y.

[21] Appl. No.: 160,994

[22] Filed: Dec. 3, 1993

[51] Int. Cl.[6] .......................... H03H 7/42; H03H 7/48
[52] U.S. Cl. ...................... 333/124; 333/25; 333/32
[58] Field of Search ............... 333/25, 32, 124; 330/116, 117, 301; 455/326, 332, 333

[56] References Cited

U.S. PATENT DOCUMENTS

| | | | |
|---|---|---|---|
| 2,165,086 | 7/1939 | Alford | 333/25 |
| 2,196,673 | 4/1940 | Gutzmann | 333/25 |
| 2,630,558 | 3/1953 | Arsem et al. | 333/25 X |
| 3,132,313 | 5/1964 | Alford | 333/32 |
| 3,146,409 | 8/1964 | Lalmond | 333/32 X |
| 4,945,317 | 7/1990 | Sato et al. | 333/25 X |

Primary Examiner—Paul Gensler
Attorney, Agent, or Firm—Steven R. Biren

[57] ABSTRACT

A balun circuit comprising a first signal source connected across a first inductive means and connected to the latter a first capacitive means. To that network are connected a second signal source, a second inductive means, and a load to be matched to the signal sources. With the right choice of component values to produce a resonant condition, a balun that interfaces two balanced signal sources to an unbalanced single-ended load results capable of low insertion loss, arbitrary impedance transformation ratio, testability in the form of a 50 ohm port for in-circuit power monitoring and circuit characterization, class E operation, and easy implementation, as only standard L and C components are necessary. The circuit is reversible for connecting a single source to a balanced load.

16 Claims, 6 Drawing Sheets

RESONANT BALUN WITH ARBITRARY IMPEDANCE

This invention relates to a balun, an electrical circuit or device for matching an unbalanced line to a balanced load.

BACKGROUND OF THE INVENTION

With radio-frequency circuit elements, transmission lines play a central role in piping electrical signals from one place to another within a circuit. To avoid undesirable reflections, the load should present an impedance equal to the characteristic impedance of the line, referred to as matching the load to the line. Known baluns, which perform this function while interfacing the line to the load, typically comprise transformer coupled windings on a ferrite core which provide fixed impedance transformations from line to load (1:1 and 4:1 are common). There are applications, however, where it would be desirable to achieve arbitrary impedance transformations, preferably with a low insertion loss. To my knowledge, baluns with these capabilities are not currently available.

SUMMARY OF THE INVENTION

An object of the invention is a balun capable of an arbitrary impedance transformation ratio between a line and a load.

Another object of the invention is a balun exhibiting low insertion loss.

Still another object of the invention is a balun providing out-of-phase signal splitting or combining, such as matching a differential signal input to a single-ended output.

These and other objects and advantages are achieved in accordance with one aspect of the invention with a circuit comprising a first signal source connected across a first inductive means and connected to the latter a first capacitive means. To that network are connected a second signal source, a second inductive means, and the load to be matched to the signal sources. With the right choice of component values, a balun that interfaces the two signal sources to a single-ended load results capable of the following properties: (1) low insertion loss, since no ferrite core is needed; (2) arbitrary impedance transformation ratio, as no magnetic coupling is involved; (3) testability in the form of a 50 ohm port for in-circuit power monitoring and circuit characterization; (4) class E operation, meaning a low differential impedance at the second harmonic of the operating frequency; (5) easy implementation, as only standard L and C components are necessary. In a preferred embodiment, the component values are chosen to satisfy a condition of resonance at the operating frequency.

The circuit is reversible in that the source can be single-ended and the output a differential output.

The circuit of the invention can be used in many ways as a standard balun, and is especially useful in a push-pull circuit such as an amplifier or mixer to provide out-of-phase signal splitting or combining.

The various features of novelty which characterize the invention are pointed out with particularity in the claims annexed to and forming a part of this disclosure. For a better understanding of the invention, its operating advantages and specific objects attained by its use, reference should be had to the accompanying drawings and descriptive matter in which there are illustrated and described the preferred embodiments of the invention.

DETAILED DESCRIPTION OF THE PREFERRED EMBODIMENTS

Figures 1, 2A:
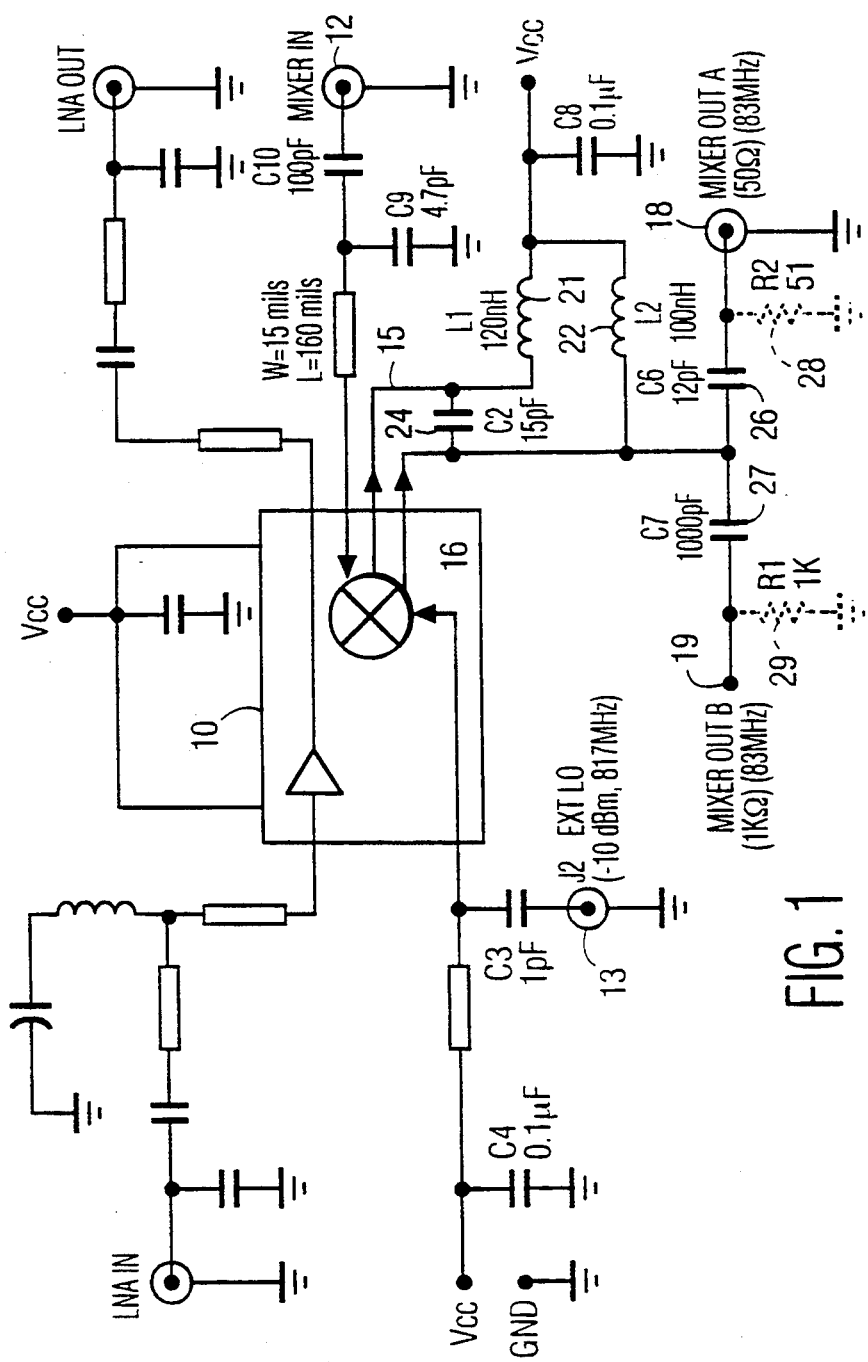
FIG. 1 is a circuit diagram of part of a combined amplifier-mixer circuit incorporating a balun in accordance with the invention.
FIG. 2A is an equivalent circuit of FIG. 2 under certain conditions.

FIG. 1 shows part of a circuit that can be used as a front end for a communication system in the 800–1200 MHz region, for example, for a cellular front end for the known systems, for RF data links, for portable radio, and for spread spectrum receivers. The centerpiece is a conventional low-noise-amplifier(LNA)/mixer combination in the form of an IC 10, for example, the Philips SA601. For present purposes, to appreciate the benefits of the invention, it is only necessary to describe the mixer part, which includes a conventional multiplier 11 to which is input an RF signal from an input 12 labelled MIXER IN and a local oscillator LO signal from an input 13 labelled EXT LO. A differential pair output 15, 16 is generated which feeds two single-ended outputs 18, 19, labelled, respectively, MIXER OUT A and MIXER OUT B. For the example given, asuming that the RF signal input is 900 MHz, and the LO signal is 817 MHz, then the two output frequencies will be 83 MHz. However, one of the outputs 18 has an output impedance of 50 ohms, whereas the other output has an output impedance of 1K ohms.

The balun circuit of the invention will divide the differential pair output 15, 16 to each of the single-ended outputs at the different impedances. That circuit comprises two inductors 21, 22, labelled L1 and L2, a capacitor 24, labelled C1, series capacitors 26, 27, labelled C6 and C7, to each of the mixer outputs, and two resistors 28, 29, shown in dashed lines and labelled R1 and R2. In actual use, only one resistor need be present. Thus, if the MIXER OUT A is used, then resistor 28 can be omitted. Conversely, if the MIXER OUT B is used, then resistor 29 can be omitted. If both outputs are used, then both resistors should be omitted. This shows an important benefit of the invention in its flexibility and matching power.

The operation of the balun circuit of FIG. 1 will be best understood by describing AC equivalent circuits of a number of different embodiments of the invention.

Figure 2:
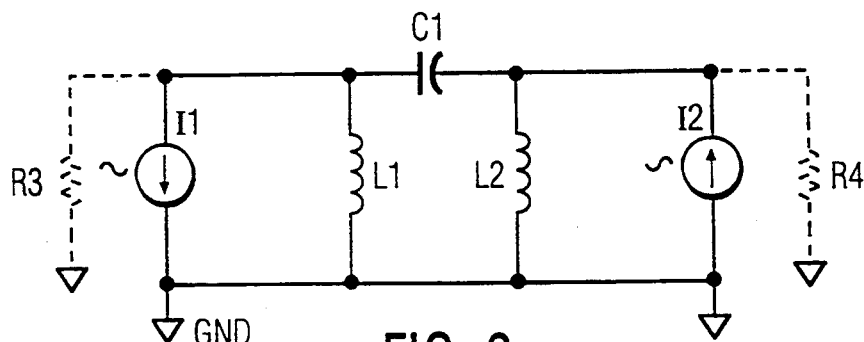
FIG. 2 is a schematic of one form of balun according to the invention showing the resonant combining principle.

FIG. 2 shows the basic resonant system of the invention, comprising two out-of-phase current sources I1, I2 at opposite ends of a Pi network of inductors L1 and L2 and capacitor C1. In dashed lines are shown resistors R3 and R4 representing parasitic resistors from non-idealized current source and inductor on each side of the Pi network. It can be shown that under the resonant condition:

$$\omega = 1/[(L1)2(C1)]^{\frac{1}{2}}, \qquad (1)$$

and the high Q condition:

$$(R3) >> \omega(L1), \qquad (2)$$

the circuit can be reduced to just the two current sources I1, I2 corresponding to the differential pair in FIG. 1 but in phase and the same two resistors R3 and R4, as shown in FIG. 2A.

Figure 3:
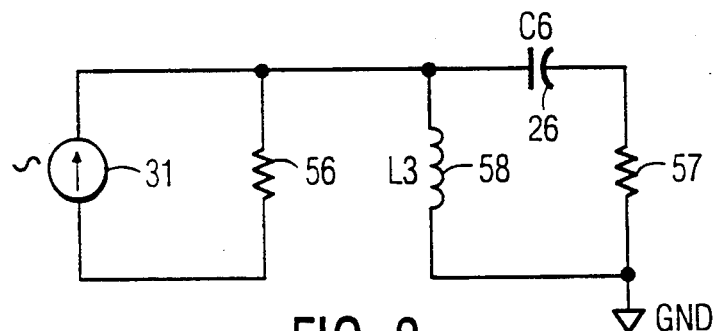
FIG. 3 is a schematic showing a power divider circuit.

FIG. 3 shows a single-ended current source 31 supplying power to resistor 56 and resistor 57 via inductor 58 and capacitor 26. When a lower value resistor load 57 is matched substantially to a higher value resistor 56 via the inductor and capacitor, there thus results equal power dissipation across resistors 57 and 56.

Figure 4:
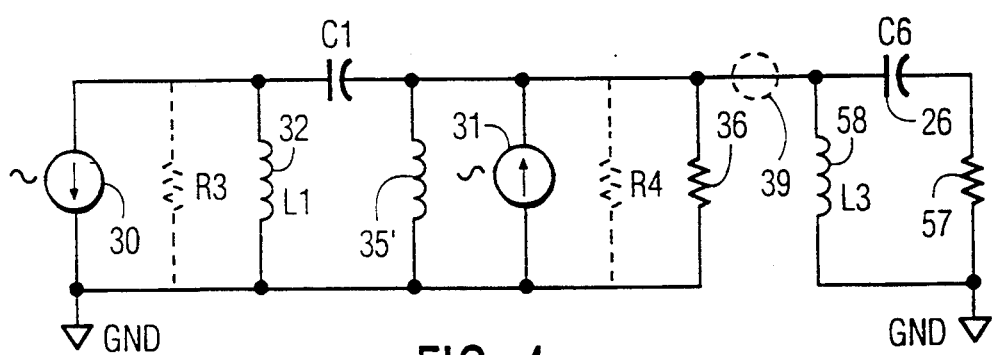
FIG. 4 is a circuit according to the invention incorporating the resonant combiner and power divider of FIGS. 2 and 3.

FIG. 4 is a circuit which combines the resonant combiner of the two current sources of FIG. 2 and the power divider of FIG. 3 in a common circuit under the condition:

$$R(56) >> (R3)/2. \qquad (3)$$

The same reference numerals and labels are used for similar parts in this and the other figures. Since inductors 35' and 58 are in parallel, they can be combined into the single inductor L2 as shown in FIG. 5.

Figure 5:
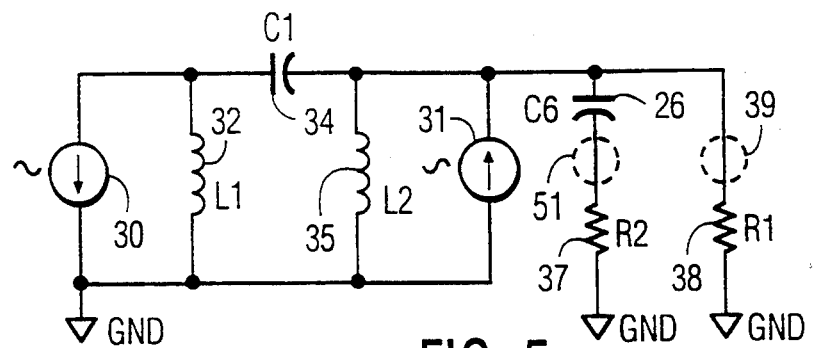
FIG. 5 is the AC equivalent circuit of the balun circuit incorporated in FIG. 1.

FIG. 5 shows a basic circuit embodiment of the invention. It comprises two current sources 30, 31 of opposite phase representing RF inputs to the circuit corresponding to the differential pair 15, 16 of FIG. 1, an inductor 32 corresponding to L1 in FIG. 1, a capacitor 34 corresponding to C1 in FIG. 1, an inductor 35 corresponding to L2 in FIG. 1, a capacitor 26 at one output corresponding to C6 in FIG. 1, a resistor 37 corresponding to R2 in FIG. 1, and a resistor 38 corresponding to R1 in FIG. 1. If desired, a capacitor (not shown) corresponding to C7 can be provided in series with resistor 38. The resistors 37, 38 correspond to resistors 28, 29 in FIG. 1, where they are shown in dashed lines to illustrate that changing the value of either of those resistors will change the impedance at the corresponding output terminal.

The circuit shown in FIG. 5 will exhibit the five advantages listed above. The value of resistor 38 will determine the output impedance at terminal 39 and thus can be chosen to equal the impedance of an arbitrary load, such as a piezoelectric filter. Then capacitor 26 and part of inductor 35 are used to match the impedance of load 37 substantially to resistor 38. Therefore, resistor 37 alternately defines the output impedance to the same level, should resistor 38 change its load value. Note, for example, that in FIG. 1, the corresponding resistor 28 for the 50 ohm output is 51 ohms and the corresponding resistor 29 for the 1 Kohm output is 1 Kohm. The opposite phase or differential inputs represented by the current sources 30, 31 will transfer power efficiently via a single-ended output, 39, to the load represented by 38, even though the inputs are balanced and the load is unbalanced. The equal power at the resistor 37 represents a second output 51 with a different output impedance, in the example of FIG. 1 of 50 ohms. This 50 ohm output 51 is useful as it provides a convenient port for monitoring the network providing the input signals. It is also conventional in this field for circuits to be characterized on the basis of a 50 ohm load, and the port 51 can be used for this purpose.

To achieve the benefits of the invention, it is important that the values of the inductor 32 (L1) and capacitor 34 (C1) satisfy the resonant condition of equation (1), where $\omega$ is the operating frequency of the network, specifically, the frequency of the current sources 30, 31. In practice, the frequency is usually fixed by the network, and L1 and C1 are chosen to satisfy equation (1).

Since real current sources and inductors exhibit losses, they can be modelled together by a shunt parasitic resistor R3 (FIGS. 2 and 6), in which case it is important that the value of the inductor L1 in FIG. 5 be chosen such that equation (2), repeated below, is satisfied:

$$(R3) >> \omega(L1). \qquad (2)$$

Also, the load impedance R1 should be chosen such that equation (3) is satisfied, which can be referred to as a lossy match. It can then be shown that the circuit of FIG. 5 can be derived from FIG. 4.

Figure 6:
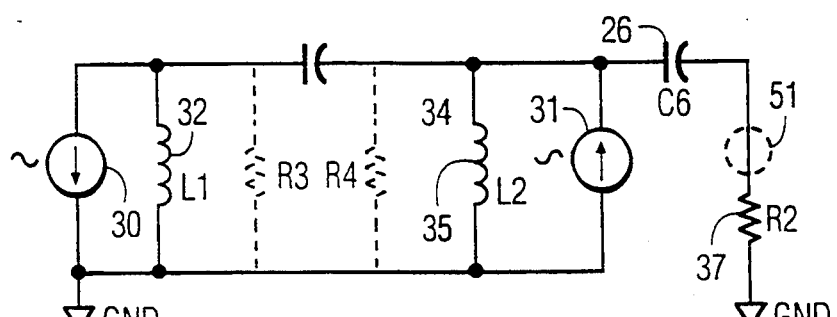
FIG. 6 is a variant of the FIG. 5 circuit.

In case satisfaction of equation (3) is not feasible, the resistor 38 (FIG. 5) can be omitted and replaced by the intrinsic resistor (R3)/2, which can be referred to as a lossless match. Under this condition, only one output is available, as shown in FIG. 6, but the power gain is still increased—3 dB in this case instead of 6 dB if two outputs were present.

For microwave circuits or high power circuits, however, it would often be difficult to meet the condition of equation (2) because the value of resistor R3 is quite low in the first place. Therefore, a modified high Q circuit can be implemented by inserting an inductor L in series with the current source (FIG. 6A), not in parallel as in FIG. 2. Then a high Q condition is met if:

$$\omega L >> (R3). \qquad (4)$$

Figure 6A:
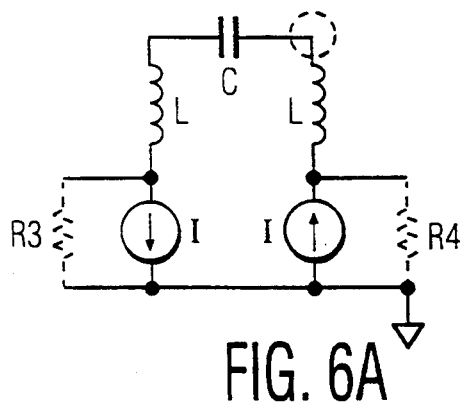
FIG. 6A is a model of the circuit of the invention for use with a low impedance source.
Figure 6B:
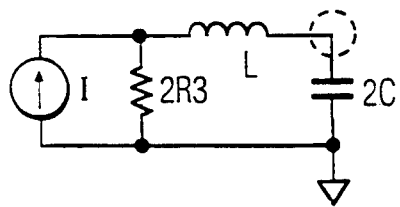
FIG. 6B is a redrawn version of the FIG. 6A model.

Based on the FIG. 6A model, which can be transformed into FIG. 6B, FIGS. 5-8 can be derived accordingly. And the power gain increase also is 3 dB.

Figure 7:
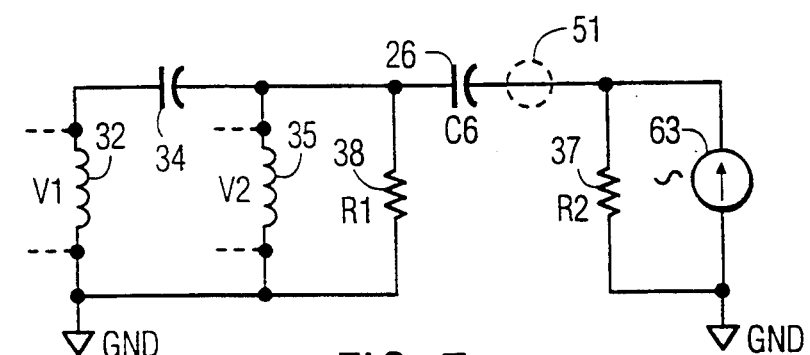
FIGS. 7 and 8 are AC equivalent circuits of balun circuit embodiments of the invention in which an unbalanced signal source is coupled to a balanced load.

The balun circuit of the invention is reversible in the sense that a single-ended input can provide an out-of-phase power splitting. This is illustrated in FIG. 7, in which case the current sources are replaced by output voltages taken across the two inductors 32, 35, and the output load in this case is replaced by a current source 63 representing an unbalanced signal input, transformed by the circuit to a balanced output which splits the voltage at the inductors 32, 35 which are out-of-phase naturally. The value of the resistor 38 determines the load impedance under the condition of equation (3).

Figure 4A:
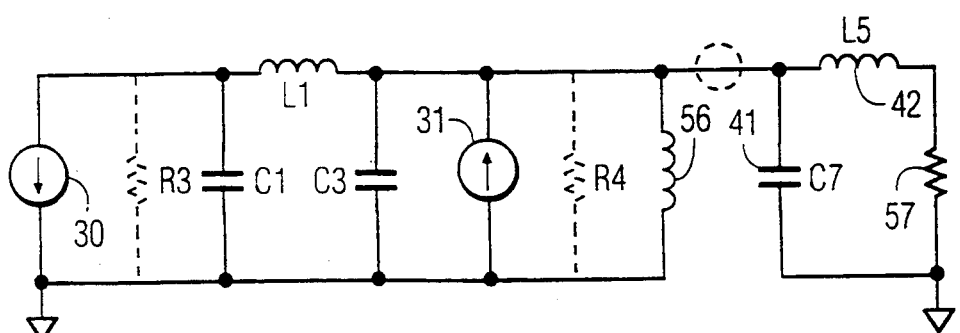
FIG. 4A is a redrawn version of the FIG. 4 circuit.
Figure 8:
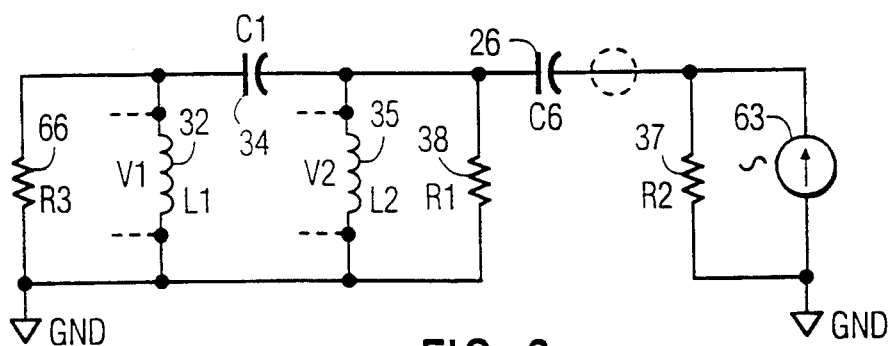

If the condition of equation (3) can not be met, then the circuit of FIG. 8 can be employed, in which the intrinsic resistors R3 and R4 are substantially matched. Due to the duality of inductor and capacitor, the circuit will produce the same result after the inductors and capacitors swap their positions. For instance, FIG. 4 can be redrawn as FIG. 4A, with inductor L5 replacing capacitor C6, capacitor C7 replacing inductor L3, and capacitor C3 replacing inductor 35'.

It will be evident from the foregoing description that the invention is not limited to the component values given which represent preferred values, and that other arrangements of the components within the principles described and which will achieve the benefits described are also considered within the scope of the invention.

Figure 9:
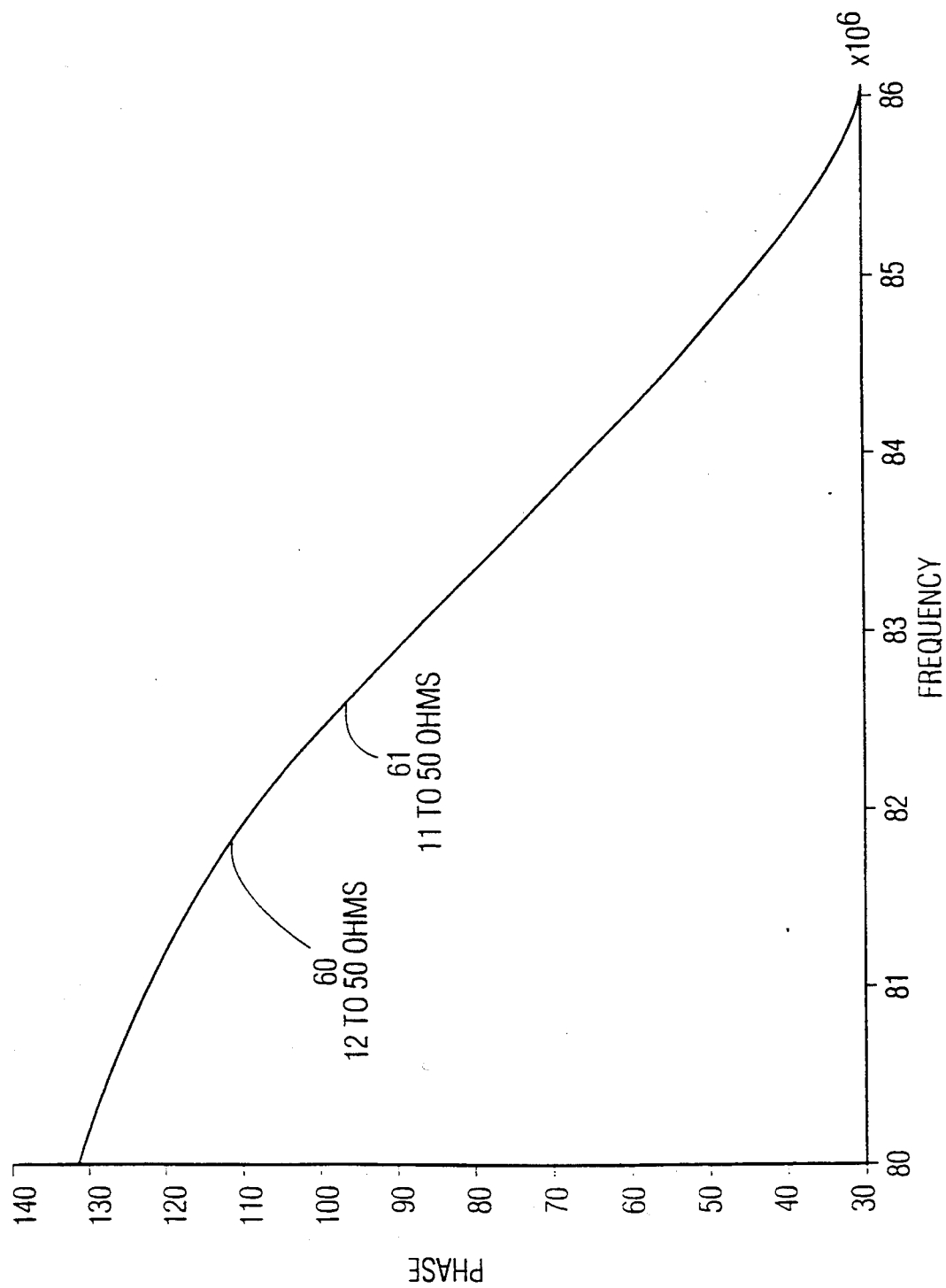
FIGS. 9 and 10 are graphs demonstrating several benefits of a balun circuit according to the invention.
Figure 10:
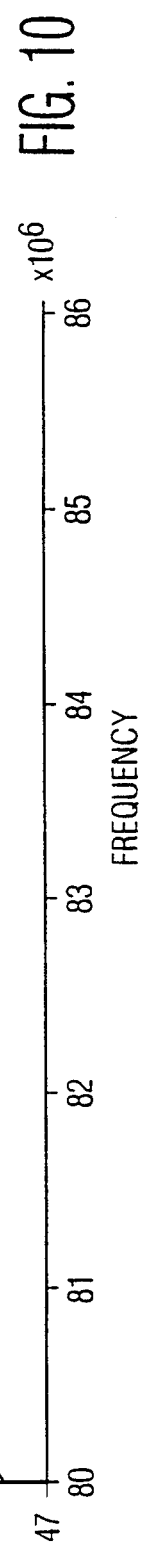

FIGS. 9 and 10 demonstrate several advantages of the invention. FIG. 9 is a graph plotting the transfer function of the balun circuit of FIG. 1 with the ordinate representing phase in degrees, and the abscissa representing frequency in MHz. The phase was plotted against frequency for two conditions: curve 60 for a transfer ratio of I2 to 50 ohms, and curve 61 for I1 to 50 ohms. Both transfer functions were so similar that the curves completely overlapped over the full frequency range shown. In FIG. 10, amplitude in dB was plotted against the same frequency range for three conditions: the top curve 62 represents superimposed plots for transfer ratios of I1 to 50 and I2 to 50 ohms with both current sources 30, 31 in FIG. 5 (both mixer outputs in FIG. 1) active or ON; the lower curve of the pair below designated 63 is for a transfer ratio of I1 to 50 ohms but with the current source 30 (FIG. 5) ON and current source 31 OFF, and the upper curve of the pair below designated 64 is for a transfer ratio of I2 to 50 ohms but with the current source 30 (FIG. 5) OFF and current source 31 ON. The curve 60,61 in FIG. 9 and the curve 62 in FIG. 10 show perfect phase transfer and equal amplitudes; the curves 63 and 64 in FIG. 10 illustrate that with only one of the current sources utilized, comparable outputs are obtained, but when they are combined in the resonant circuit according to the invention, the greatly increased output by as much as 6 dB represented by curve 62 is obtained.

FIG. 1 gives an example of suitable values for the components of the balun of the invention, but it will be understood that the invention is not limited to a circuit with those values and those skilled in the art by following the principles described herein will be able to select other component values to obtain a circuit exhibiting the benefits of the invention.

While the invention has been described in connection with preferred embodiments, it will be understood that modifications thereof within the principles outlined above will be evident to those skilled in the art and thus the invention is not limited to the preferred embodiments but is intended to encompass such modifications.

What is claimed:

1. A resonant balun circuit comprising:
first and second balanced input ports for receiving a balanced input signal at an operating frequency $\omega$;
a reference voltage terminal;
a first inductance having a value L1 connected between the first input port and the reference voltage terminal;
a second inductance having a value L2 connected between the second input port and the reference voltage terminal;
a first capacitance having a value C1 connected between the first and second input ports, the first capacitance also substantially satisfying the condition $$\omega = 1/[(L1)2(C1)]^{\frac{1}{2}};$$

a first unbalanced output port; and
a second capacitance connecting the second input port to the first output port.

2. A resonant balun as defined in claim 1 wherein a supply voltage source is connected to the reference voltage terminal.

3. A resonant balun as defined in claim 1 wherein the reference voltage terminal is connected to ground.

4. A resonant balun as defined in claim 1 and further comprising a load connected to the first output port.

5. A resonant balun as defined in claim 1 and further comprising a second unbalanced output port connected to the second input port.

6. A resonant balun as defined in claim 5 and further comprising a load connected to said second output port.

7. A resonant balun as defined in claim 1 and further comprising:
a first signal source connected to the first input port, the combined shunt resistance of the first signal source and the first inductance having a value of R3 where $R3 >> \omega(L1)$; and
a second signal source connected to the second input port, the first and second signal sources having opposite phase.

8. A resonant balun as defined in claim 7 and further comprising a load having a value R1 connected to the first output port.

9. A resonant balun as defined in claim 8 and further comprising a second unbalanced output port connected to the second input port.

10. A resonant balun as defined in claim 9 and further comprising a load having a value R3 connected to said second output port.

11. A resonant balun as defined in claim 10 wherein $$R1 >> (R3)/2.$$

12. A resonant balun circuit comprising:
first and second balanced input ports for receiving a balanced input signal at an operating frequency $\omega$;
a first capacitance having a first and second end;
a first inductance having a value L1 connecting the first input port to the first end of the first capacitance;
a second inductance having a value L2 connecting the second input port to the second end of the first capacitance;
the first capacitance having a value C1 and substantially satisfying the condition $$\omega = 1/[(L1)2(C1)]^{\frac{1}{2}};$$

a first unbalanced output port; and
a second capacitance connecting the second end of the first capacitance to the first output port.

13. A resonant balun as defined in claim 12 and further comprising:
a first signal source connected to the first input port, the combined shunt resistance of the first signal source and the first inductance having a value of R3 where $\omega(L1) >> R3$; and
a second signal source connected to the second input port, the first and second signal sources having opposite phase.

14. A resonant balun circuit comprising:
an unbalanced input port for receiving an unbalanced input signal at an operating frequency $\omega$;
first and second balanced output ports;
a reference voltage terminal;

a first inductance having a value L1 connected between the first output port and the reference voltage terminal;

a second inductance having a value L2 connected between the second output port and the reference voltage terminal;

a first capacitance having a value C1 connected between the first and second output ports, the first capacitance also substantially satisfying the condition $$\omega = 1/[(L1)2(C1)]^{\frac{1}{2}};$$

and a second capacitance connecting the second output port to the input port.

15. A resonant balun circuit as defined in claim 14 and further comprising a resistance connected across the second inductance.

16. A resonant balun circuit comprising:

first and second balanced input ports for receiving a balanced input signal at an operating frequency $\omega$;

a reference voltage terminal;

a first capacitance having a value C1 connected between the first input port and the reference voltage terminal;

a second capacitance having a value C2 connected between the second input port and the reference voltage terminal;

a first inductance having a value L1 connected between the first and second input ports, the first inductance also substantially satisfying the condition $$\omega = 1/[(L1)2(C1)]^{\frac{1}{2}};$$

a first unbalanced output port; and a second inductance connecting the second input port to the first output port.

* * * * *